United States Patent
Glew et al.

(10) Patent No.: US 6,239,454 B1
(45) Date of Patent: May 29, 2001

(54) NET STRAIN REDUCTION IN INTEGRATED LASER-MODULATOR

(75) Inventors: Richard W. Glew, Lehigh; Judith A. Grenko, Reading, both of PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/307,898

(22) Filed: May 10, 1999

(51) Int. Cl.[7] .................................................. H01L 33/00
(52) U.S. Cl. .................................................. 257/94; 257/14
(58) Field of Search .................................. 257/94, 14

(56) References Cited

U.S. PATENT DOCUMENTS

| | | |
|---|---|---|
| 5,257,276 | 10/1993 | Forouhar et al. . |
| 5,339,325 | 8/1994 | Kito et al. . |
| 5,548,607 | 8/1996 | Tsang . |
| 5,862,166 * | 8/1999 | Anayama ................................. 372/43 |
| 5,937,273 * | 8/1999 | Fujii et al. ............................. 438/46 |

* cited by examiner

*Primary Examiner*—Olik Chaudhuri
*Assistant Examiner*—Douglas A. Wille

(57) ABSTRACT

A semiconductor device including first and second epitaxial layers grown in a selective area growth region on a substrate includes an active layer or well layer comprising a first composition formed using a trimethylgallium precursor material and a barrier layer comprising a second composition formed using a triethylgallium precursor material. The use of the first and second compositions in the well layer and barrier layer respectively maximizes the strain in the well layer while simultaneously minimizing the net strain of the selective area growth region.

15 Claims, 5 Drawing Sheets

NET STRAIN REDUCTION IN INTEGRATED LASER-MODULATOR

BACKGROUND OF THE INVENTION

1. Field of the Invention

The present invention relates to a semiconductor device having a heterostructure with a plurality of active material well layers alternately grown between a plurality of barrier layers and having a reduced net strain. More specifically, the present invention relates to an integrated semiconductor laser-modulator device exhibiting a reduced net strain, and to a process for manufacturing such a semiconductor device.

2. Description of the Related Art

During the manufacturing of heterojunction semiconductor devices, each individual layer is grown epitaxially using one of many known growth techniques such, for example, as metal-organic chemical vapor deposition (MOCVD). Several layers are usually grown when producing a multiple quantum well (MQW) semiconductor such as an MQW laser so that alternating layers of active material well layers and barrier material layers are grown. In addition, the alternating layers are bound between a pair of separate confinement layers (SCLs).

With respect to MQW semiconductor laser devices, it is known that a lattice mismatch between the alternating layers produces a strain in the active layer and affects the energy band structure of the quantum well and the wavelength of the light output from the quantum well. Furthermore, in line with continuing efforts to miniaturize and maximize the efficiency of semiconductor components, MQW semiconductor laser devices are being integrally designed with other element devices such as modulators. Referring to FIG. 1, a known integrated laser-modulator device 102 includes active layers 112 and barrier layers 110 comprising a plurality of quaternary layers bound between SCLs 118 grown on substrate 114. The laser region 106 of this device is grown by a selective area growth (SAG) process in which the epitaxial growth of the layers is confined between two pads 116 comprising, for example, an oxide. The laser region 106 and the modulator region 104 of the device are grown simultaneously. The growth of the laser region 106 between the two oxide pads causes an increase in the growth rate (thickness) and strain in the laser region 106 as compared to the planar growth in the modulator region 104. The resulting difference in thickness and strain causes the characteristic wavelength of the SAG or laser region to be longer than the characteristic wavelength of the modulator region.

It is also known that for satisfactory operation of an Electro-Modulated Laser or Electroabsorption-Modulated Laser (EML), which includes an integrated laser and modulator, a large change in strain is required in the well layer between the laser region and the modulator region of the device to effect the longer characteristic wavelength. However, the barrier and SCL layers do not require a large change in strain between the laser and modulator portions of the semiconductor device. It is also known that it is important to minimize the total amount of strain in the laser section. Each laser has a strain limit which is the maximum net strain that it can accommodate. The efficiency of a laser decreases as the net strain increases, so that the further the net strain is from the strain limit, the better. Designers must thus balance the requirement for a large change in strain between the laser and modulator with the relationship between the net strain and efficiency of the laser.

One prior art solution for affecting the strain is to carefully optimize the quaternary compositions used to form the semiconductor layers to achieve the desired characteristics of each layer. This procedure is however difficult to carry out because it generally requires time-consuming trial and error experimentation, yet yields only minimal improvements.

SUMMARY OF THE INVENTION

The present invention utilizes the differences in the thickness and strain characteristics that are produced in epitaxial layers using different gallium precursors in the formation of the compositions of the alternating epitaxial layers to reduce overall net strain of a semiconductor while maintaining proper operation. In a rudimentary embodiment of the present invention, the well layers of a multiple quantum well (MQW) configuration use a trimethylgallium (TMG) gallium precursor material and the barrier layers of the MQW configuration use a triethylgallium (TEG) gallium precursor material. This combination maximizes the strain in the well layers and simultaneously minimizes the overall or net strain of the semiconductor, an important and highly advantageous result because in certain semiconductor devices, the well layers are required to have as large a strain as possible. However, each semiconductor device also has a maximum strain limit which limits the total amount of strain that can be accommodated. In addition, the efficiency of the semiconductor decreases as the net strain increases. Therefore, the strain in the well layer should be kept large for proper operation of the semiconductor device while minimizing the strain in the barrier layer so as to maximize the operating efficiency of the device.

In a more specific embodiment, the semiconductor device is an electromodulated laser or electroabsorption-modulated laser (EML) (i.e., an integrated lasermodulator) having a laser region and a modulator region simultaneously grown on one substrate. The laser region is formed by a selective area growth (SAG) process in which the epitaxial growth of the barrier and well layers is confined between two oxide pads. As a consequence of the selective area growth process, the strain in the well layer of the laser region is greater than the strain of the same well layer in the modulator region. Satisfactory operation of the EML device requires a relatively large difference between the strain in the well layers of the laser region and the strain in the well layers of the modulator region. On the other hand, it is not required that there be a difference in strain between the barrier layers of the laser region and the barrier layers of the modulator region.

The net strain of the laser section is also a critical parameter. Each laser section can accommodate up to a maximum amount of strain, which is referred to as the strain limit. In addition, the efficiency of the laser decreases as the net strain in the laser section increases. Therefore, in designing an EML device, the strain difference between the wells of the laser section and the wells of the modulator section is advantageously maximized while simultaneously limiting the net strain of the laser section so that the efficiency of the device does not become unsatisfactory.

In accordance with the present invention, the difference between the thickness and strain characteristics of barrier and well layers formed from TMG and TEG gallium precurser materials is utilized to reduce the net strain by maintaining an adequate difference in strain between the well layers of the laser section and the well layers of the modulator section while minimizing the strain in the barrier layers of the laser. Using this inventive arrangement, the strain difference between the well layers of the laser region and the well layers of the modulator region may be maintained at a satisfactory level while reducing the net strain in the laser section and thereby increasing the efficiency of the EML device over those of the prior art. The prior art does not exploit the different characteristics of compositions grown from TEG and TMG gallium precursor materials to reduce the net strain in the laser section or in any semiconductor device having an MQW configuration.

The compositions used for the barrier layers and the well layers are preferably quaternary compositions of GaInAsP which is grown using the metal-organic chemical vapor deposition (MOCVD) process.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference characters denote similar elements throughout the several views.

DETAILED DESCRIPTION OF THE CURRENTLY PREFERRED EMBODIMENTS

In accordance with the present invention, the net strain of a multiple quantum well (MQW) configuration of a semiconductor device is controlled by selecting different gallium precursor materials for the formation of the barrier and well layers of the MQW configuration.

Quaternary composition layers of GaInAsP are used for forming the epitaxial layers of the MQW configuration. These compositions are formed by a metallo-organic chemical vapor deposition (MOCVD) in which precursor materials are introduced into a chamber with a gas for forming the layers on a substrate. In accordance with the invention, it has been found that changing a gallium precursor material from triethylgallium (TEG) to trimethylgallium (TMG) affects the strain and thickness of the layers being formed. Each of the graphs in FIGS. 2a–2d shows a comparison between the thickness or strain in the modulator region and the laser region for first and second types of epitaxial layer compositions of a multiple quantum well (MQW). The modulator region is a planar growth section while the laser region is formed using a selective area growth (SAG) process between two 30 μm pads separated by a 20 μm gap. Each of the epitaxial layers comprises a quaternary composition including Gallium, Indium, Arsenic, and Phosphorous. In the herein disclosed embodiment, the first type of epitaxial layer comprises a first quaternary composition that is formed using Triethylgallium (TEG) as a gallium precursor material, and the second type of epitaxial layer comprises a second quaternary composition that is formed using Trimethylgallium (TMG) as the gallium precursor material. As depicted in the FIGS. 2a–2d, the first quaternary composition (TEG composition) exhibits a greater thickness and lower strain in the well layer of the laser region than the second quaternary composition (TMG composition).

In order to compare the different characteristics of compositions formed using the TEG and TMG gallium precursor materials, quaternary composition layers were formed using an indium precursor material comprising trimethylindium (TMI), Arsenic and Phosphorous precursor materials respectively comprising Arsine and Phosphine, and one of the TEG and TMG gallium precursor materials. However, it should be understood that other types of precursor materials may also be used for the source of Arsenic and Phosphorous including, for example, tertiarybutylarsine (TBA) and tertiarybutylphosphine (TBP).

Figure 1:
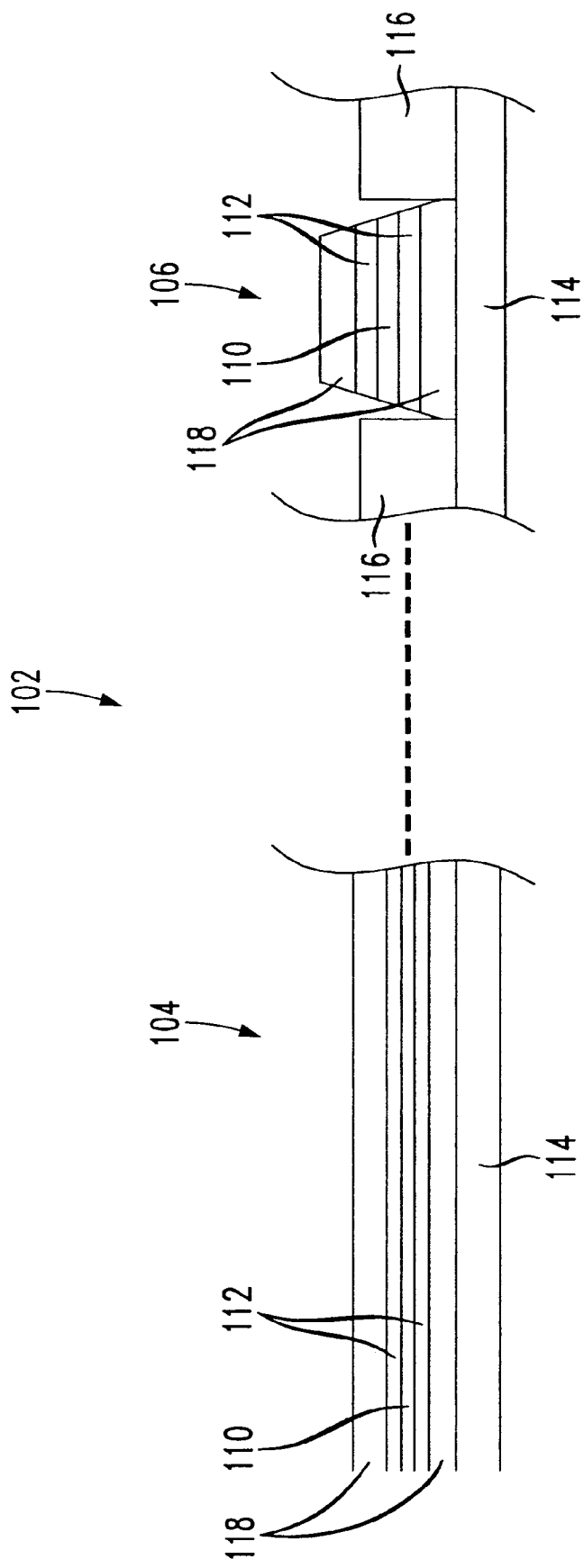
FIG. 1 is a partial cross sectional view of a modulator region and a laser region of a prior art integrated laser-modulator.
Figure 2A:
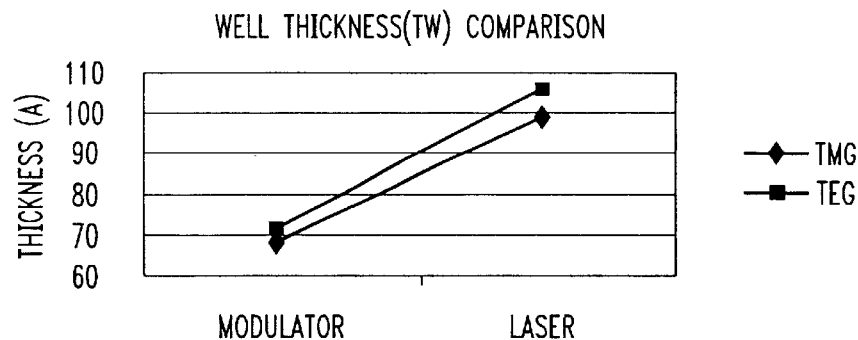
FIG. 2a is a graph comparing the thickness characteristics of well layers comprising Triethylgallium (TEG) to well layers comprising Trimethylgallium (TMG) in an integrated laser-modulator.
Figure 2B:
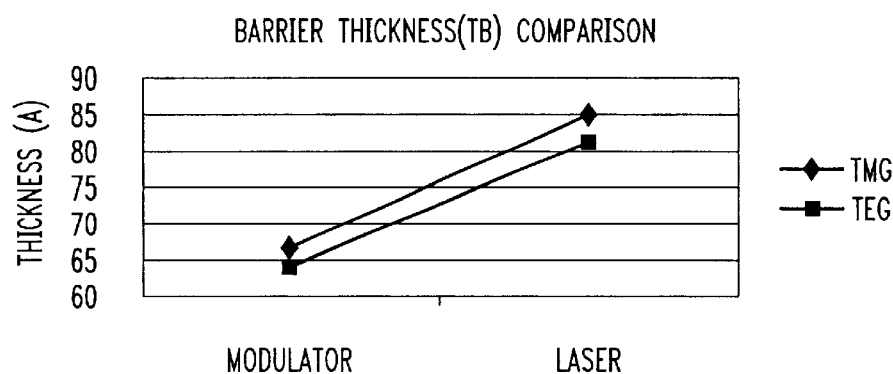
FIG. 2b is a graph comparing the thickness characteristics of barrier layers comprising Triethylgallium (TEG) to barrier layers comprising Trimethylgallium (TMG) in an integrated laser-modulator.
Figure 2C:
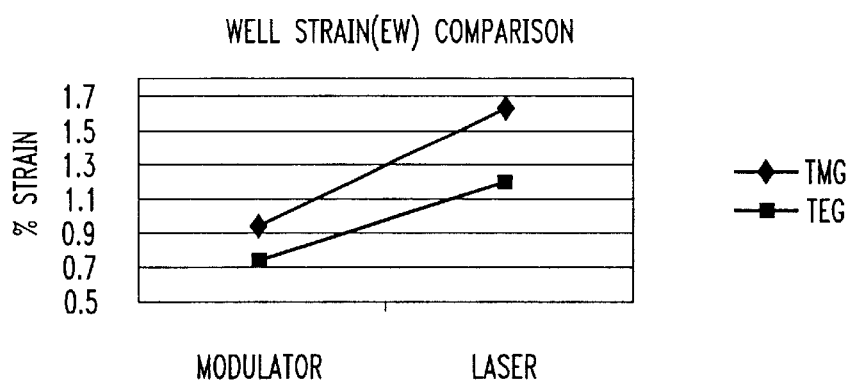
FIG. 2c is a graph comparing the strain characteristics of well layers comprising Triethylgallium (TEG) to well layers comprising Trimethylgallium (TMG) in an integrated laser-modulator.
Figure 2D:
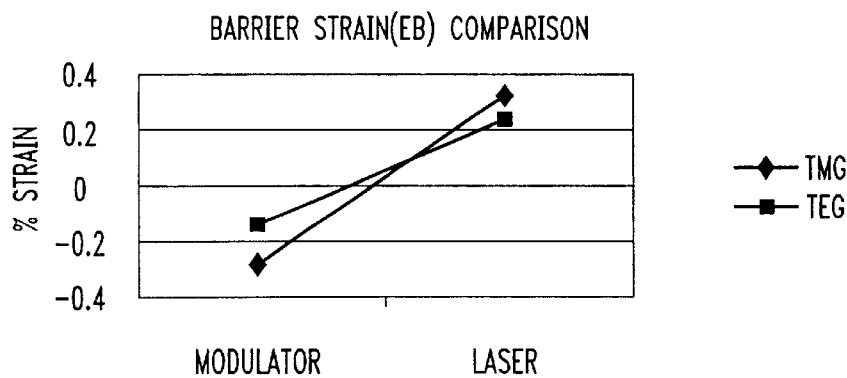
FIG. 2d is a graph comparing the strain characteristics of barrier layers comprising Triethylgallium (TEG) to barrier layers comprising Trimethylgallium (TMG) in an integrated laser-modulator.
Figure 3:
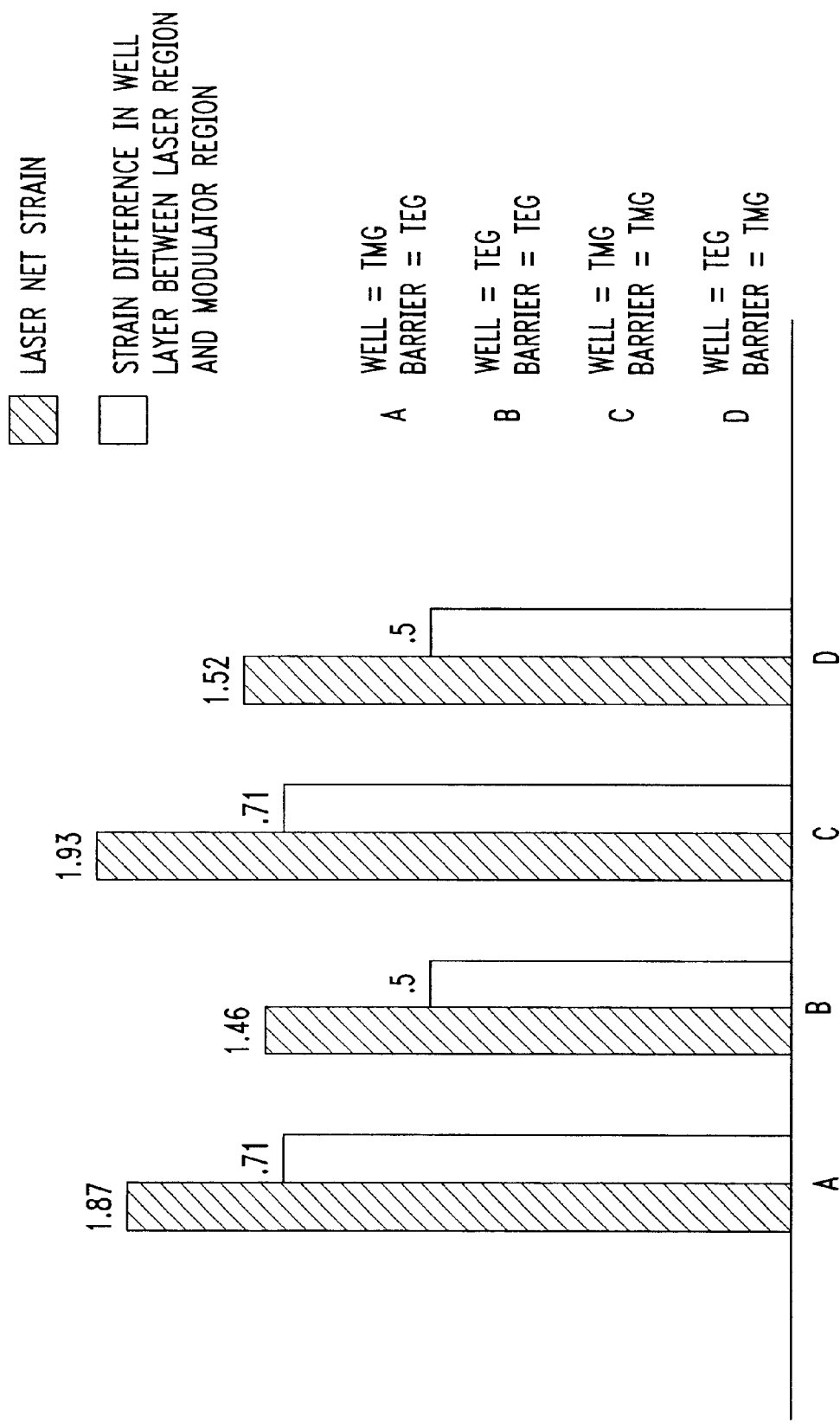
FIG. 3 is a bar graph depicting the laser net strain and strain difference between well layers in the laser region and modulator region of an electro-modulated laser using layers with different compositions.

FIG. 3 is a bar graph that depicts the laser net strain of one barrier layer and one well layer in the laser region and the strain difference in well layers between the laser region and the modulator region. The bar graph displays relative differences in the characteristics of structures formed using different combinations of compositions for the well layers and the barrier layers. An analysis of this bar graph reveals that for combination A, in which the TEG composition is used in the barrier layers and the TMG composition is used in the well layers, the resulting structure includes well layers that exhibit a large strain difference between the laser region and modulator region due to the use of the TMG composition, and a smaller strain in the barrier layer of the laser region due to the use of the TEG composition. As pointed out above, a large difference in the strain of the well layers between the two regions is advantageous for proper operation of the EML.

In combination B of FIG. 3, the TEG composition is used for both the barrier layers and well layers. Using this combination, the strain difference between the well layers of the laser region and the well layers of the modulator region is reduced, thereby reducing the effectiveness of the laser modulator. The lower net strain that is produced by combination B does not overcome the detrimental effect of the decrease in the difference in strain in the well layers.

Combination C of FIG. 3 uses the TMG composition for both the barrier layers and the layers. The strain difference in the well layers between the laser region and the modulator region using combination C is the same as that obtained using combination A. However, the net strain in the laser region increases relative to that for combination A, thus reducing the efficiency of the laser region.

Finally, in combination D the TEG composition is used for the well layer and the TMG composition is used for the barrier layer. This combination exhibits similar characteristics to those obtained using combination B.

Thus, the graph of FIG. 3 indicates that combination A is best at producing the desired characteristics of a high strain difference between the well layers of the laser region and modulator region and a low net strain in the laser region.

Figure 4:
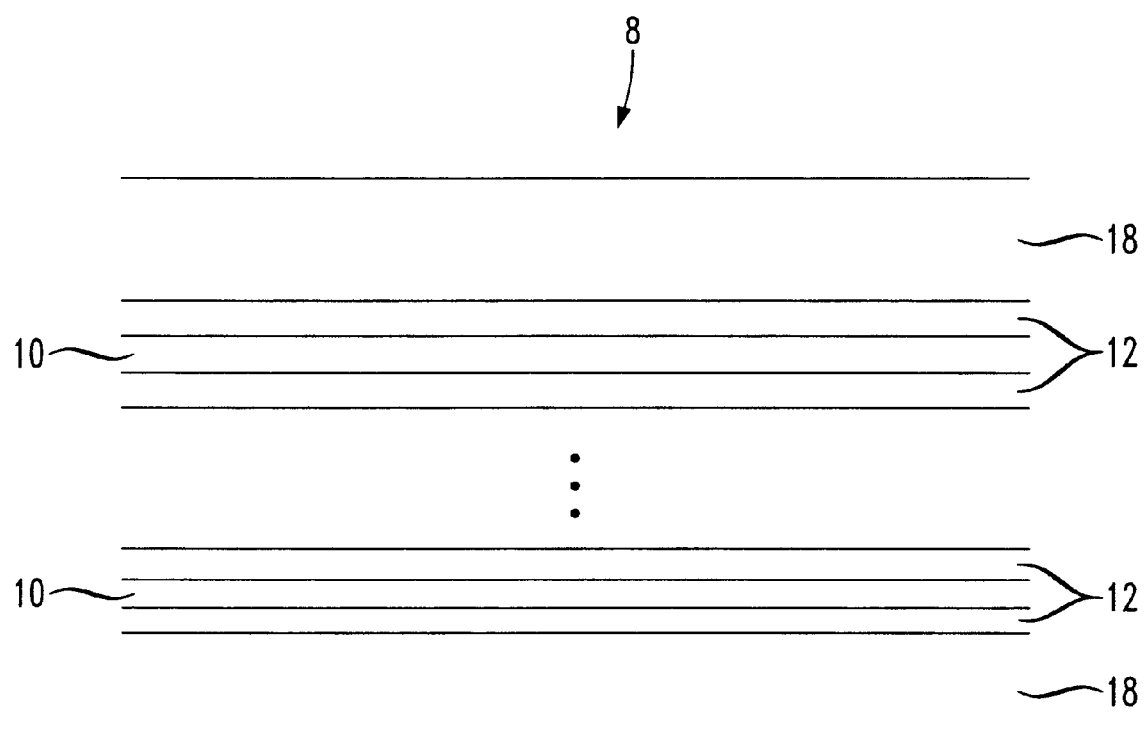
FIG. 4 depicts the cross section of an active section of a semiconductor according to an embodiment of the present invention.

FIG. 4 depicts an active region of a semiconductor device 8 fabricated in accordance with an embodiment of the invention having a plurality of alternately formed well layers 12 and barrier layers 10 surrounded by a cladding or separate confinement layers (SCLs) 18. This semiconductor device 8 is formed on a substrate (not shown) between two pads using a selective area growth (SAG) process. To maximize the strain in the well layers 12 while simultaneously minimizing the net strain of the entire semiconductor device 8, the well layers 12 comprise the TMG composition and the barrier layers 10 and SCLs 18 comprise the TEG composition.

Figure 5:
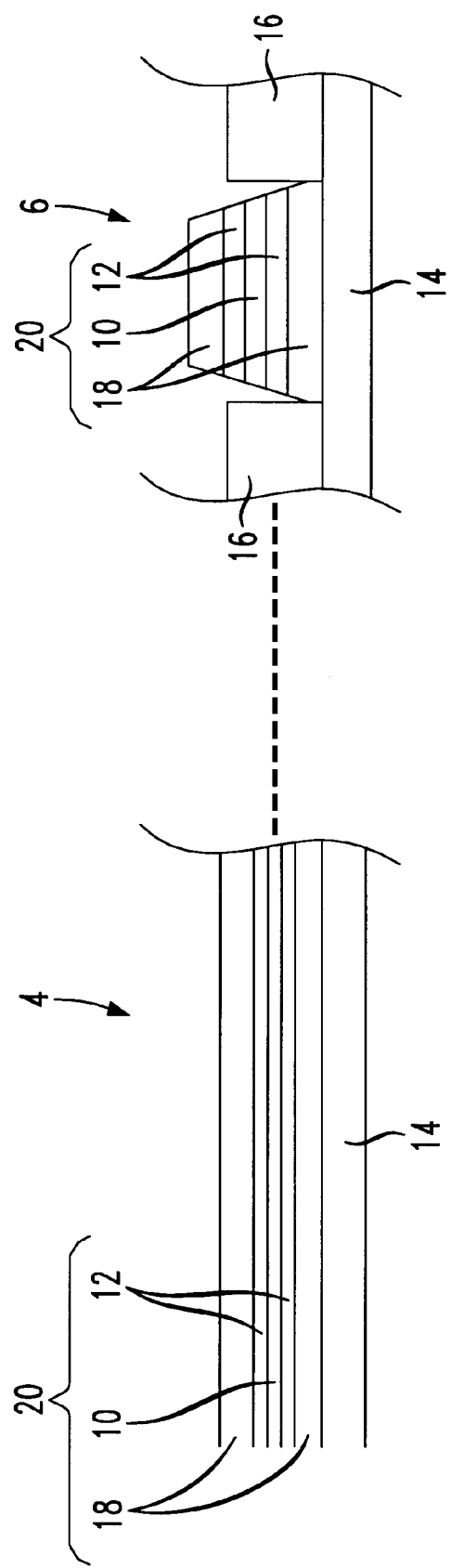
FIG. 5 shows cross sections of the modulator region and laser region of an electro-modulated laser according to an embodiment of the present invention.

FIG. 5 shows an embodiment of the invention including an electro-modulated laser or electroabsorption-modulated laser (EML) 2 having a modulator region 4 and a laser region 6. Modulator region 4 is a planar region and laser region 6 is formed between two pads 16 such, for example, as oxide pads via a selective area growth (SAG) process. Epitaxial layers 20 are grown on a substrate 14 simultaneously in the modulator region and the laser region using a crystal growth technique such, for example, as metalorganic chemical vapor deposition (MOCVD). The epitaxial layers 20 comprise SCLs 18, well layers 12 and barrier layers 10. Although two well layers 12 and one barrier layer 10 are shown, any number of these layers may be used or provided depending on the requirements of the particular EML 2 in which they are defined. The characteristic wavelength of the laser region 6 is larger than the characteristic wavelength of the modulator region 4 because the SAG process used to form the laser region 6 produces a greater strain in each layer and a greater thickness of each layer as a result of an increased growth rate as compared to modulator region 4. It is advantageous for satisfactory operation of the EML 2 that the strain in the well layers 12 of laser region 6 be larger than the strain in the well layers 12 of modulator region 4. Moreover, the amount of net strain that can be accommodated by a laser region is limited to the strain limit of that particular laser region. The strain of the barrier layer 10 neither adds nor detracts from proper operation of the EML 2. The well layers 12 therefore comprise the TMG composition to maximize the strain difference between the strain of the well layers in the laser region and the strain of the well layers in the modulator region, and the barrier layers 10 and SCLs 18 comprise the TEG composition so that the net strain of the laser region 6 is minimized for a given strain in well layer 12.

While there have shown and described and pointed out fundamental novel features of the invention as applied to preferred embodiments thereof, it will be understood that various omissions and substitutions and changes in the form and details of the devices illustrated, and in their formation, may be made by those skilled in the art without departing from the spirit of the invention. For example, it is expressly intended that all combinations of those elements and/or method steps which perform substantially the same function in substantially the same way to achieve the same results are within the scope of the invention. It is the intention, therefore, to be limited only as indicated by the scope of the claims appended hereto.

We claim:

1. A semiconductor device, comprising:

a substrate having a selective area growth region;

a multiple quantum well structure comprising first and second epitaxial layers formed on said substrate in said selective area growth region; and said first epitaxial layer being a well layer of said multiple quantum well structure comprising a first composition formed using a trimethylgallium (TMG) precursor material and said second epitaxial layer being a barrier layer of said multiple quantum well structure comprising a second composition formed using a triethylgallium (TEG) precursor material.

2. The semiconductor device of claim 1, wherein said first and second compositions comprise quaternary compositions.

3. The semiconductor device of claim 2, wherein said quaternary compositions comprise Gallium, Indium, Arsenic, and Phosphorous.

4. The semiconductor device of claim 1, further comprising pads mounted on said substrate and defining a gap therebetween for forming said selective area growth region.

5. The semiconductor device of claim 4, wherein said gap between said pads comprises a distance of approximately 20 $\mu$m.

6. The semiconductor device of claim 5, wherein said pads are 30 $\mu$m wide.

7. The semiconductor device of claim 1, further comprising a pair of separate confinement layers respectively formed above and below said first and second epitaxial layers on said substrate.

8. The semiconductor device of claim 1, further comprising a planar region on said substrate; and said first and second epitaxial layers being formed in both said selective area growth region and said planar region on said substrate.

9. The semiconductor device of claim 8, wherein said selective area growth region comprises a laser region and said planar area comprises a modulator region.

10. The semiconductor device of claim 8, wherein said first and second compositions comprise quaternary compositions.

11. The semiconductor device of claim 10, wherein said quaternary compositions comprise Gallium, Indium, Arsenic, and Phosphorous.

12. The semiconductor device of claim 8, further comprising pads mounted on said substrate and defining a gap therebetween for forming said selective area growth region.

13. The semiconductor device of claim 12, wherein said gap between said pads comprises a distance of approximately 20 $\mu$m.

14. The semiconductor device of claim 13, wherein said pads are 30 $\mu$m wide.

15. The semiconductor device of claim 8, further comprising a pair of separate confinement layers respectively formed above and below said first and second epitaxial layers on said substrate.

* * * * *